(12) United States Patent
Leaver et al.

(10) Patent No.: US 6,195,788 B1
(45) Date of Patent: Feb. 27, 2001

(54) MAPPING HETEROGENEOUS LOGIC ELEMENTS IN A PROGRAMMABLE LOGIC DEVICE

(75) Inventors: Andrew Leaver, Milpitas; Francis B. Heile, Santa Clara, both of CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/169,213

(22) Filed: Oct. 9, 1998

Related U.S. Application Data

(60) Provisional application No. 60/062,242, filed on Oct. 17, 1997.

(51) Int. Cl.[7] .................................................. G06F 17/50
(52) U.S. Cl. .................................................. 716/18; 716/16
(58) Field of Search ............................................ 716/1–21

(56) References Cited

U.S. PATENT DOCUMENTS

| | | | |
|---|---|---|---|
| 5,636,368 | * | 6/1997 | Harrison et al. ....................... 716/16 |
| 5,734,582 | * | 3/1998 | Bertolet et al. ......................... 716/8 |
| 5,974,242 | * | 10/1999 | Damarla et al. ........................ 716/2 |
| 6,102,964 | * | 8/2000 | Tse et al. .............................. 716/18 |

OTHER PUBLICATIONS

Bursky, Dave, "Combination RAM/PLD Opens New Application Options", Electronic Design, pp. 138–140, May 23, 1991.
Intel Corporation "10 ns FLEXlogic FPGA With SRAM Option", Intel®'iFX780, pp. 2–24—2–46, Nov. 1993.
NGAI, Tony Kai–Kit, "An SRAM–Programmable Field–Reconfigurable Memory", Department of Electrical Engineering, University of Toronto, Thesis for Master of Applied Science, 1994.
Altera Corporation APEX 20K Programmable Logic Device Family, ALTERA®'Oct. 1998, ver. 1.

* cited by examiner

Primary Examiner—Kevin J. Teska
Assistant Examiner—Phallaka Kik
(74) Attorney, Agent, or Firm—Beyer Weaver & Thomas, LLP

(57) ABSTRACT

A method and mechanism for mapping heterogeneous logic elements in a portion of electronic design compilation for a programmable integrated circuit is disclosed. Specifically, the invention provides a method to perform the technology mapping of heterogeneous logic elements in a programmable logic device such as selectively choosing the best combination of product term logic elements and look up table logic elements.

29 Claims, 12 Drawing Sheets

MAPPING HETEROGENEOUS LOGIC ELEMENTS IN A PROGRAMMABLE LOGIC DEVICE

CROSS REFERENCE TO RELATED APPLICATION

This application claims priority of provisional U.S. patent application Ser. No. 60/062,242, filed Oct. 17, 1997, entitled "HETEROGENEOUS TECHNOLOGY MAPPING FOR LUTS AND PRODUCT TERMS" which is incorporated by reference.

BACKGROUND OF THE INVENTION

This invention relates to methods for fitting logic functions in an integrated circuit. More specifically, the invention relates to performing the fitting function using heterogeneous logic elements.

During the design phase of a new electronic product (e.g., an integrated circuit), logic functions must be designed, tested, and ultimately laid-out on a substrate (e.g., silicon or other semiconductor). The layout component of this process typically involves mapping hardware independent logic cells onto elementary units of hardware to form logic elements. Subsequent steps involve placement of these logic elements onto specified locations on the substrate and routing lines between the various logic blocks on the substrate. These functions are generically referred to as "place and route."

In some electronic products—notably some programmable logic devices—the layout of logic on the substrate assumes a hierarchy. In this hierarchy, fundamental units of logic may be referred to as logic cells or logic elements. These logic cells may be grouped into larger blocks of logic that may be referred to as "logic array blocks" for example. These blocks of logic may, in turn, be grouped into rows and ultimately columns on the hardware device.

Modern tools for designing electronic products are implemented as software. This software may allow the designer to specify the desired functioning of the end device, as well as some architectural and logic constraints. The software tools can take this information and, with the designer's aid, develop Boolean, schematic, and ultimately hardware designs. In the design process, the software fits the logic onto the hardware device to provide the final design layout.

Typically the design software "compiles" a design to produce a hardware layout. Compilation takes as an input a user's specifications (including high and low level logic constraints, timing requirements, etc.) and then synthesizes that design maps it onto elementary units of hardware, and fits it onto a target hardware device. In the case of programmable devices, the resulting compiled electronic design is then used to program a blank (unprogrammed) device. Designs for application specific integrated circuits, including programmable logic devices (PLDs) and field programmable gate arrays, as well as non-programmable electronic devices such as gate arrays all may require compilation involving synthesis of logic functions and fitting.

Normally, during PLD compilation, a user's design requirements are first synthesized to generate the gates and nets necessary to implement the design. The synthesized design is then "mapped" to a particular target hardware device. The target hardware device will have elementary units of hardware on which logic is implemented. The PLD into which the synthesized design is being mapped is typically homogeneous in that the PLD contains a single type of elementary logic unit. Such elementary logic units can include look up table (LUT) type logic devices as well as product term type (PTERM) logic devices. In the case of look-up table devices, the elementary unit may be a logic element that includes a four input look-up table together with a register. In the case of a product term device, the fundamental hardware unit is a product term or product term cell. One example of the homogeneous type PLD architecture is illustrated by the FLEX PLD architecture manufactured by the Altera Corporation of San Jose, Calif. having logic elements in the form of look up tables (LUT). However, the RAPHAEL programmable logic device also developed by the Altera Corporation contains a heterogeneous environment. In that environment, logic may be mapped to look up tables and product terms on a target hardware device In the case of the RAPHAEL architecture, speed and size considerations militate in favor of PTERM logic elements over LUT type logic cells. However, since there are typically more LUT type logic elements than PTERM logic elements, the mapping must be carried out with the view to optimize the use of the PTERM logic elements. After the logic has been mapped into PTERM and LUT logic elements, the resulting elements are fit onto the hardware device by a place and route procedure.

The mapping process is dependent upon the particular hardware architecture employed and mapping to look up table architectures is fundamentally different than mapping to product term architectures. For this reason, it is desirable to find methods and mechanisms for use in mapping heterogeneous logic elements in a programmable logic device.

SUMMARY OF THE INVENTION

The present invention provides a method and mechanism for mapping heterogeneous logic elements in a portion of electronic design compilation for a programmable integrated circuit. Specifically, the invention provides a method to perform the technology mapping of heterogeneous logic elements in a programmable logic device. In a preferred embodiment, the method performs the operations necessary to selectively map heterogeneous logic cells for use in a hierarchical electronic design. In a particularly preferred embodiment, the method selectively chooses the combination of product term logic elements and look up logic elements.

One aspect of the invention provides a method of compiling an electronic design. The method is performed by forming a first logical region using the first type logic device and forming a second logical region using the second type logic device, wherein the first logical region and the second logical regions perform logically equivalent sub-functions of the electronic design. The first logical region and the second logical regions are then compared, and then based upon the comparing, either the first or the second logical region is selected based upon a pre-determined factor. The chosen logical region is then added to a final mapping list. The method proceeds until the electronic design is fully mapped.

In a preferred embodiment of the invention, heterogeneous logic elements include PTERM logic elements and LUT logic elements.

These and other features and advantages of the present invention will be further described in the following description of the invention in conjunction with the associated figures.

BRIEF DESCRIPTION OF THE DRAWING

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1A:
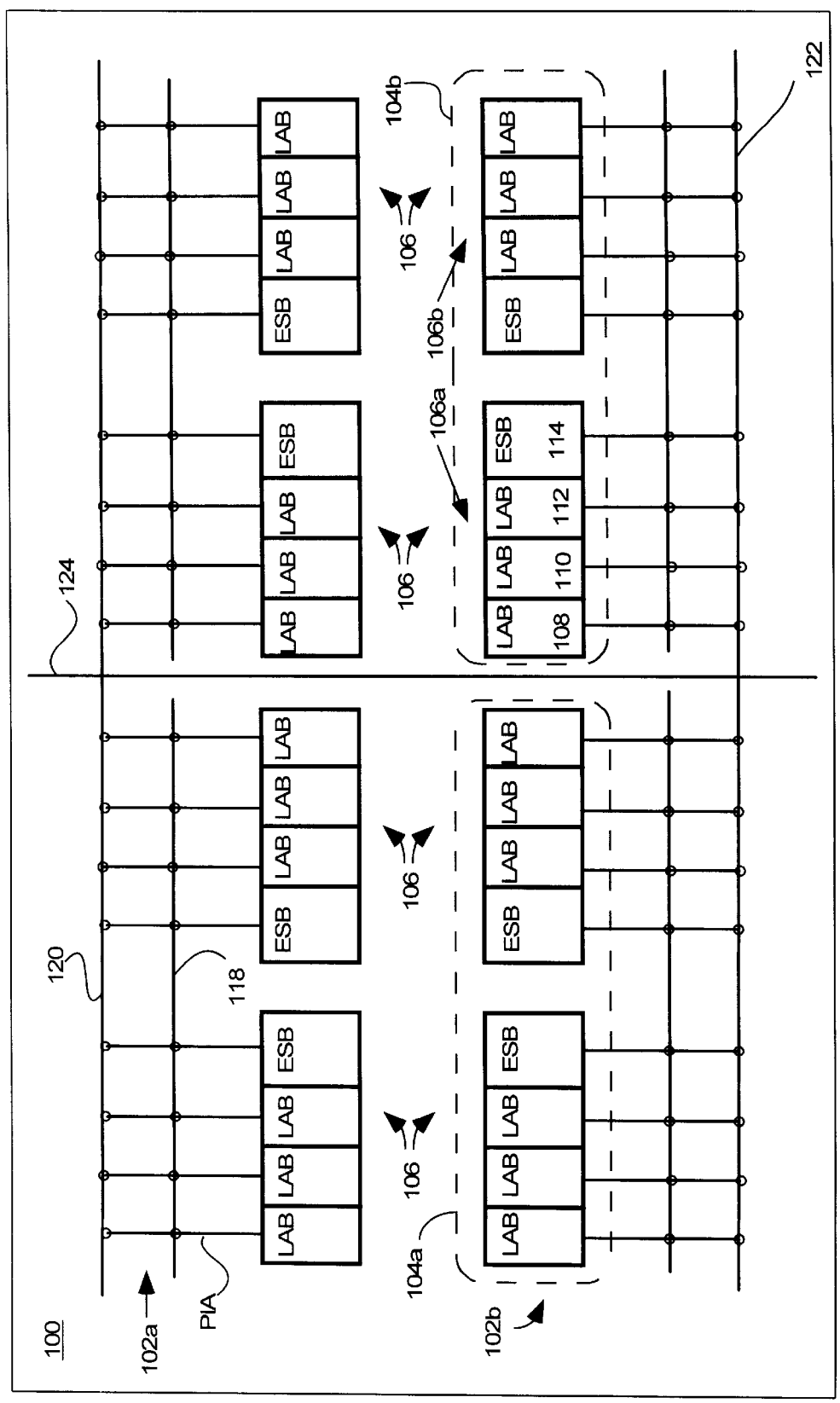
FIG. 1A shows a programmable logic device having a heterogeneous in accordance with an embodiment of the invention.

Some of terms used herein are not commonly used in the art. Other terms have multiple meanings in the art. Therefore, the following definitions are provided as an aid to understanding the description that follows. The invention as set forth in the claims should not necessarily be limited by these definitions.

The term "compiler" is used throughout this specification to refer to software—and apparatus for running such software—that compiles an electronic design. Its functions may include extracting and synthesizing a netlist, mapping the design to a given hardware architecture, fitting the design, simulating the design, etc.

The term "electronic design" generically refers to the logical structure of an electronic device such as an integrated circuit. It may be implemented on hardware (usually referred to herein generically as a "target hardware device"). During the design and development effort, an electronic design may exist in various states or stages. It may be provided as a high level Boolean representation (encoded in a hardware design language for example), a schematic or circuit representation, or any other form representing the logical arrangement of a device. It may include other facets such as floor-plan constraints, wave-form constraints, timing constraints, fitting constraints, etc. At the gate level, it may exist as a netlist (whether synthesized or not) prior to placement on a target hardware device. It may even include completed place and route assignments.

The term "target hardware device" refers to a hardware device on which an electronic design is implemented. Examples include circuit boards and systems including multiple electronic devices and multi-chip modules, as well as integrated circuits. Specific examples of integrated circuits include traditional integrated circuits with fill custom layouts, hardwired ASICs (e.g., gate arrays) designed with high level design tools, and programmable ASICs such as FPGAs and PLDs. In the case of non-programmable integrated circuits such as gate arrays, the electronic design defines the arrangement of metal lines on one or more metallization layers of the target hardware device. In the case of programmable integrated circuits such as PLDs, the electronic design defines the gates as well as interconnects to be programmed on the target hardware device.

In the context of this invention, a target hardware device typically includes a plurality of logic elements which house logic cells from an electronic design in order to implement the logic functions specified by these cells (hardware independent gate level logic). The logic elements are typically a fundamental element of the hardware device's architecture on which different logic gates can be defined. These elements may be grouped into blocks such that each logic element is associated with a block (or other arbitrary containment entity). There may be higher level organization in the device such that logic blocks are grouped into rows or some other arbitrary entity.

The term "mapping" refers to a process of grouping gates from a netlist or other hardware-independent representation of logic into logic cells. In other words, an electronic design may be divided into logic cells representing various logic functions within the electronic design. These logic cells are mapped onto logic elements of the target hardware device during compilation. The criteria for mapping gates into logic cells is that a resulting logic cell must be able to be put into one logic element. An example of a logic cell is a collections of gates (connected in some way and implemented in a PLD look-up table) combined with a register and configured to implement a multiplexer. Mapping preferably takes place during compilation of a design and may be implemented by a "technology mapper" module of a compiler.

The term "fitting" is used to describe a process whereby a compiler fits an electronic design onto a target hardware device. The term "fit" may be used interchangeably with the phrase "place and route." As this synonym suggests, fitting can be divided into two phases: a placement phase and a routing phase. At this phase, a compiler positions premapped logic cells of the electronic design onto the target hardware device. The invention may employ generic place and route algorithms—including many conventional and commercially available algorithms—employed during design development.

In FIG. 1A, a programmable logic device 100 having a heterogeneous architecture is shown. The PLD 100 is representative of a RAPHAEL type programmable logic device available from Altera Corporation of San Jose. The programmable logic device 100 is segmented into a plurality of "rows" to facilitate interconnection between logic elements on a given row. In the example shown, there are two rows: 102a and 102b. Each row of programmable logic device 100 is farther subdivided into two "half-rows." For example, row 102b is shown to contain a half-row 104a and a half-row 104b. The next lower level of the architectural hierarchy is a group of LABs referred to as a MegaLAB. Half-row 104b, for example, contains two MegaLABs: a MegaLAB 106a, and a MegaLAB 106b. The next lower level of the architectural hierarchy are the group of logic elements forming a typical MegaLAB. These logic elements include logic array blocks (LABs) and embedded system blocks (ESB). In the embodiment shown in FIG. 1B, LABs, as represented by the LAB 108, are formed of logic elements (LE), such as LE 108a–108d. In the described embodiment, the logic elements are in turn based upon 4 input look up table (LUT) and an associated register illustrated in FIG. 1C.

At the base of the of the architectural hierarchy are the logic elements represented by look up table (LUT) type logic contained within each LAB and the P-Term logic element included in the ESB. By way of example, the LAB 106c includes two logic elements: a logic element 108a and a logic element 108b.

Referring again to FIG. 1A, the ESBs are operable in either a conventional RAM mode or a P-term mode that is described in Heile's U.S. application Ser. No. 09/034,050 filed Mar. 3, 1998 which is hereby incorporated by reference herein in its entirety. By way of example, the ESB 114 can be configured to operate in the P-term mode since the ESB includes circuitry which can be operated either as random access memory ("RAM") or to perform product term ("P-term") logic. In the RAM mode, each individual row of a memory array included in the ESB is separately addressable for writing data to the memory array or reading data from the memory array. Alternatively, in P-term mode, multiple rows of the memory array are addressable in parallel to read product terms from the memory array. The capability of the memory circuitry to perform product term logic provides an efficient way to perform wide fan-in logic functions which would otherwise require multiple combinatorial logic trees. In short, product term devices are formed in arrays including multiple wordlines and bitlines. The wordlines typically come in pairs, with one member of the pair specifying an input value and the other member of the pair specifying its compliment. At the intersection of any pair of such wordlines with a bitline, one or no members of the pair are "programmed." When the intersection is programmed, a programmable bit is set to connect the wordline to the bitline. The programmable bit is usually a memory element such as an EPROM, an EEPROM, a flash element, or an SRAM. When programmed or "set", the memory element applies the potential of the corresponding wordline to the bitline. However, the actual output potential on a given bitline is typically the function of the potential on multiple wordlines which intersect the bitline. Each wordline on the bitline for which a bit is programmed influences the actual output of the bitline.

In short, PLD 100 includes four levels of architectural hierarchical: (1) rows, (2) half-rows, (3) MegaLABs, and (4) logic elements. Any logic element within PLD 100 can be uniquely specified (and located) by specifying a value for each of these four levels of the containment hierarchy. For example, logic element 108b can be specified as follows: row (2), half-row (2), LAB (1), LE (2).

Figure 1B:
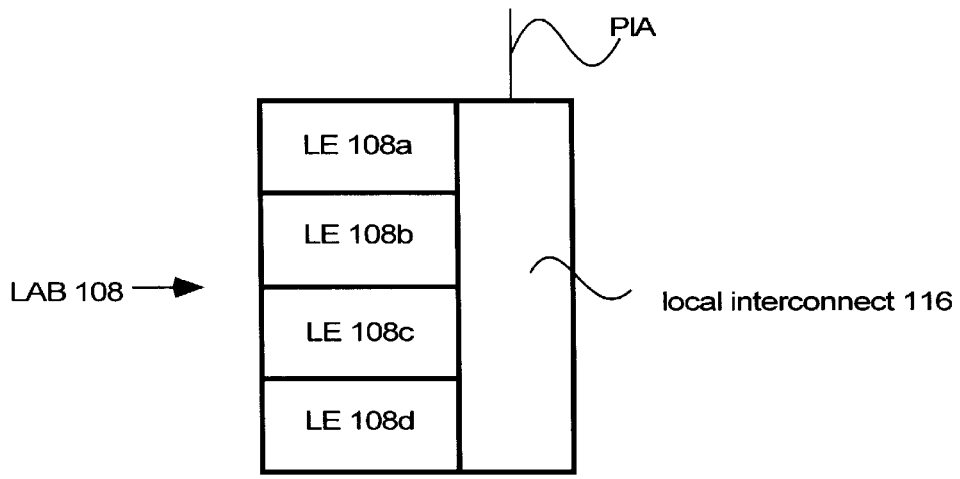
FIG. 1B is a simplified block representation of a logic array block (LAB) and its constituent elementary logic elements (LEs) in the form of a look up table (LUT)
Figure 1C:
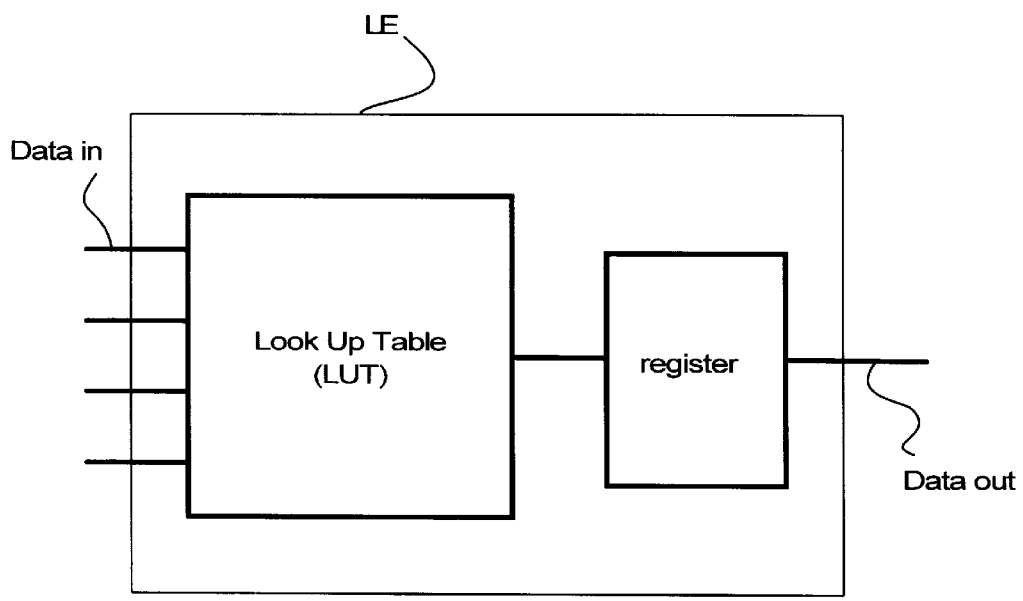
FIG. 1C is a simplified block representation of a logic element showing a look up table and associated register as shown in FIG. 1C.

A multi-level PLD architecture such as that shown in PLD 100 may include multiple levels of routing lines (interconnects). These connect the uniquely placed logic cells to complete circuits. In PLD 100, for example, four levels of interconnect are provided, one for each of the four hierarchical levels. First, as shown in FIG. 1B, a local interconnect such as interconnect 116 is employed to connect two logic elements, such as LE 108a and 108b, within the LAB 108. These are the fastest interconnects. Although not shown for sake of clarity, a programmable interconnect array (PIA) programmably connects each of the LABs within a particular MegaLAB to each other as well as to the ESB within the MegaLAB. The PIAs also connect each of the LABs and ESBs within each MegaLAB to other conductors included within the PLD 100. At the next level, a MegaLAB-to-MegaLAB interconnect such as interconnect 118 is employed to connect two MegaLABs within the same half-row. At the next higher level, a "global horizontal" interconnect is employed to programmably connect MegaLABs (and the LABs and ESBs included therein by way of their associated PIAs) in the same row but in different half-rows. An example of a global horizontal interconnect is interconnect 120 shown in row 102a. Another global horizontal interconnect is shown as interconnect 122, linking logic elements within row 102b. Finally, a "global vertical" interconnect is employed to link a MegaLAB in one row with a MegaLAB in a different row. For example, a global vertical interconnect 124 connects a MegaLAB of the row 102a to two separate MegaLABs (106a and 106b) in row 102b. In the embodiment shown, this is accomplished by providing global vertical interconnect 124 between the above-described MegaLABs in row 102a to global horizontal interconnect 122 in row 102b.

In a target hardware device, there will be many paths available for routing a given signal line. To the extent possible, signals should be transmitted via local interconnects. This is the fastest way to get a signal from one logic element to another and it is the goal of partitioning.

The interconnect structure and overall architecture of Altera PLDs is described in much greater detail in U.S. Pat. No. 5,550,782, issued on Aug. 27, 1996, naming Cliff et al. As inventors, and entitled "PROGRAMMABLE LOGIC ARRAY INTEGRATED CIRCUITS." That application is incorporated herein by reference for all purposes. Additional discussion of other PLD products may be found in the Altera 1998 Data Book available from Altera Corporation of San Jose, Calif. The Data Book is incorporated herein by reference for all purposes.

Briefly, in the RAPHAEL architecture, the PLD array is divided into quadrants each having at least three rows, with two half-rows per row, and two MegaLABs per half-row. Each MegaLAB includes at least 16 LABs and one PTERM ESB. Each LAB includes logic elements each of which, in turn, includes a 4-input look-up table, a programmable flipflop, and dedicated signal paths for carry and cascade functions. The eight logic elements in LAB can be used to create medium-sized blocks of logic—such as 8-bit counters, address decoders, or state machines—or combined across LABs to create larger logic blocks.

It should be understood that the present invention is not limited to the Altera RAPHAEL architecture or any other hardware architecture for that matter. In fact, it is not even limited to programmable logic devices. It may be employed generically in target hardware devices as broadly defined above and preferably in application specific integrated circuit designs. PLDs are just one example of the Integrated circuits that can benefit from application of the present invention.

Figure 2:
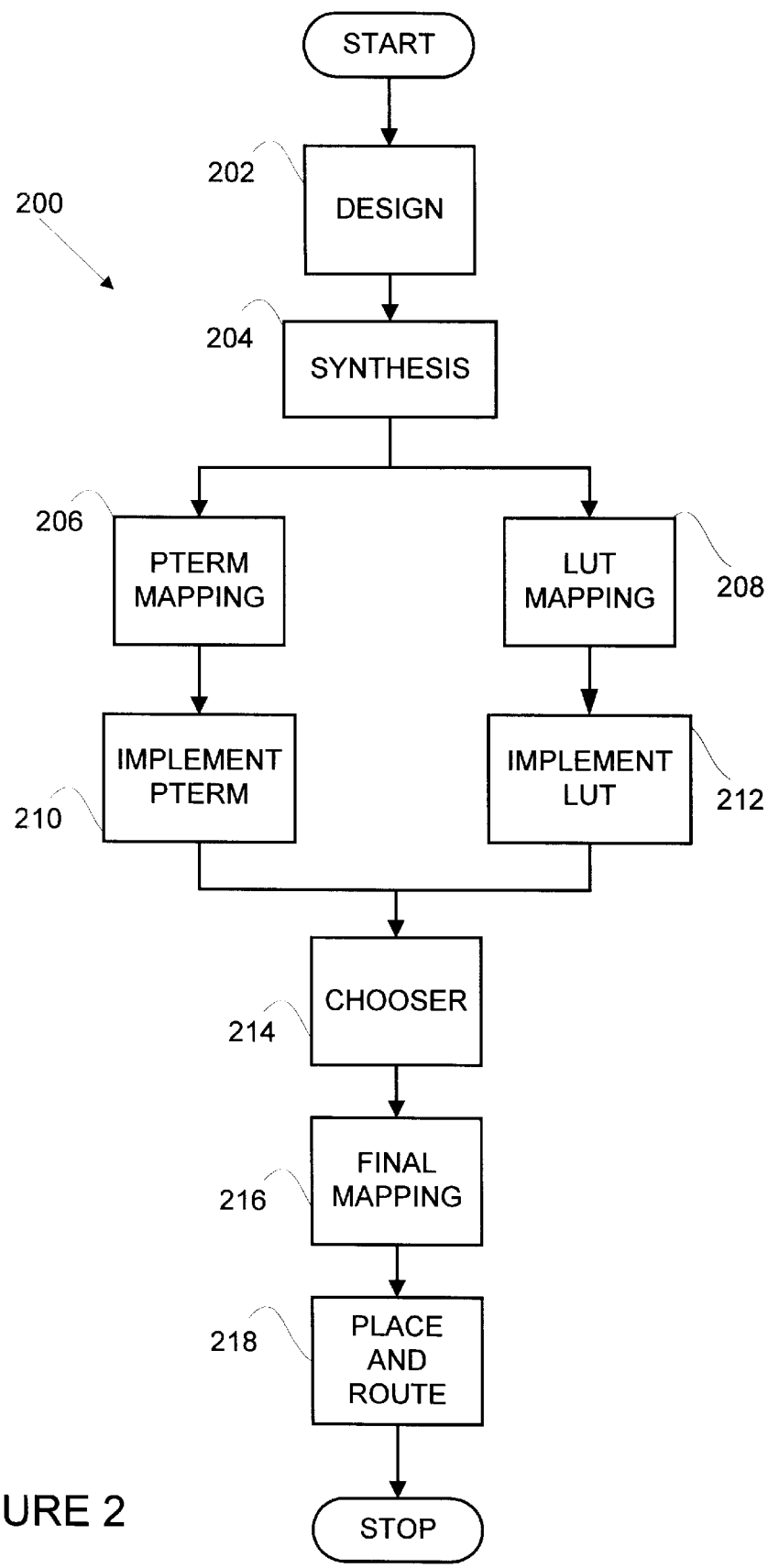
FIG. 2 details a process for compiling an electronic design in a heterogeneous architecture in accordance with an embodiment of the invention.

To compile an electronic design onto a target hardware device such as that shown in FIG. 1A, a process detailed in FIG. 2 may be followed. First, a compiler takes as an input user's specifications 202. The input specifications may include, as examples, high and low level logic constraints, timing requirements, etc. The compiler then synthesizes that electronic design 204 generating in the process a "netlist" that is used to describe the functionality of the electronic design that can be implemented on a programmable logic device or other target hardware device. The netlist is represented as hierarchical collection of gates, state machines, high level constructs such as counters or adders, or any other means of defining a collection of outputs based on a collection of inputs. The nodes of the netlist (gates, state machines, etc.) are connected together via nets. Each of these nets is associated with a named digital signal. A netlist may be synthesized to remove redundant logic, simplify the gate layout provided by a user, etc. In a preferred embodiment, both a LUT netlist and a PTERM netlist are generated for the electronic design being compiled. Because netlists are hardware independent, the LUT and PTERM netlists typically will be identical.

When in the form of a synthesized netlist, an electronic design may be divided into "logic cells" representing various logic functions within the electronic design. In the process 200, a PTERM mapping (206) and a LUT mapping (208) of the electronic design are created in parallel. The compiler then uses the PTERM mapping to "implement" the electronic design (210) in the form of logic regions such as PTERM logic cones described below. The compiler also uses the LUT mapping to implement the electronic design (212) in a form such as LUT logic cones also described below. It should be noted, that in a preferred embodiment, the PTERM logic cones and the LUT logic cones represent regions of equivalent logic such that PTERM and LUT logic cones can be paired accordingly.

Once the electronic design has been reduced to PTERM and LUT logic cone pairs, a choosing process (214) selects the best one of each pair according to a predetermined selection criterion. Such selection criterion can include, for example, logic density, speed, etc. Once all the appropriate logic cones have been selected, the chosen logic cones are used to form a final mapping (216) which in turn are fitted (218) to the target hardware device, which in this example, is the PLD 100.

The individual logic cones are generated for the purpose of comparing PTERM mapping to LUT mapping. Thus, it is important that functionally equivalent (or similar) logic regions be compared. The logic cones serve this purpose. They represent equivalent logic regions that have been separately mapped for PTERM and LUT hardware. Note that other regions of equivalent logic (other than the cones described herein) could be employed.

To generate the logic cones described herein, one starts with "anchors" which are logic elements that generate the same logic function at their respective outputs. Because they are identically implemented, they conveniently serve as input and output boundaries for logic cones. Examples of anchors include registers and I/O ports as well as any combinational logic elements that generate the same logic functions at their outputs, as above.

Figure 3:
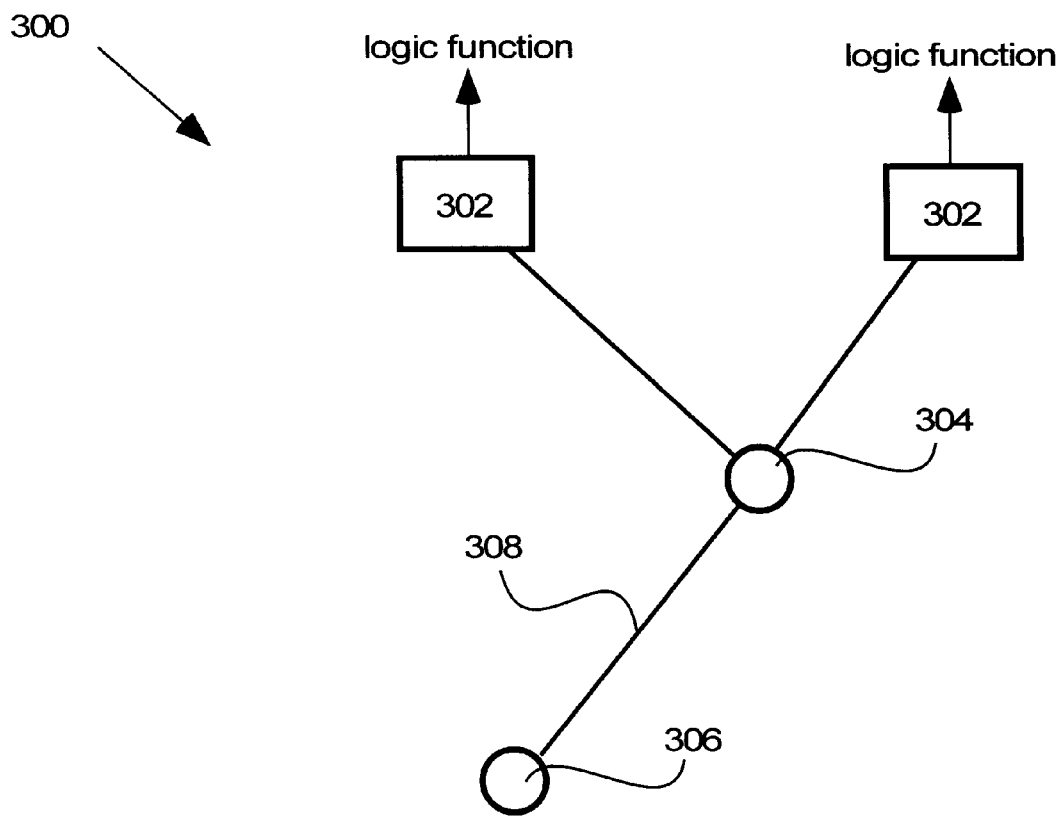
FIG. 3 illustrates a portion of an exemplary netlist in accordance with an embodiment of the invention.

One useful representation of the netlist described above can be seen in FIG. 3 showing a connectivity diagram 300 representing a portion of a netlist generated during a typical compilation project. The connectivity diagram 300 is associated with a particular logic function that is defined as an output signal at an I/O pin 302 (an example of an anchor) by the logic nodes 304 and 306 (e.g., gates). It should be noted that the nodes 304 and 306 are connected together by way of a net 308. Note also that there are two instances of I/O pin 302 in this example, each receiving the same logic signal from node 304. In this case, the compilation software, for example, gives the I/O pin 302, or anchor, a unique name in the netlist representative of the particular logic function. Therefore, in any netlist generated for the particular electronic design, all I/O pins, registers, and the like having the same name represent the same logic function regardless of how many logic nodes are connected thereto. In this way, any number of different netlists for the same electronic design can be compared for such characteristics as speed, logic density, etc.

Figure 4A:
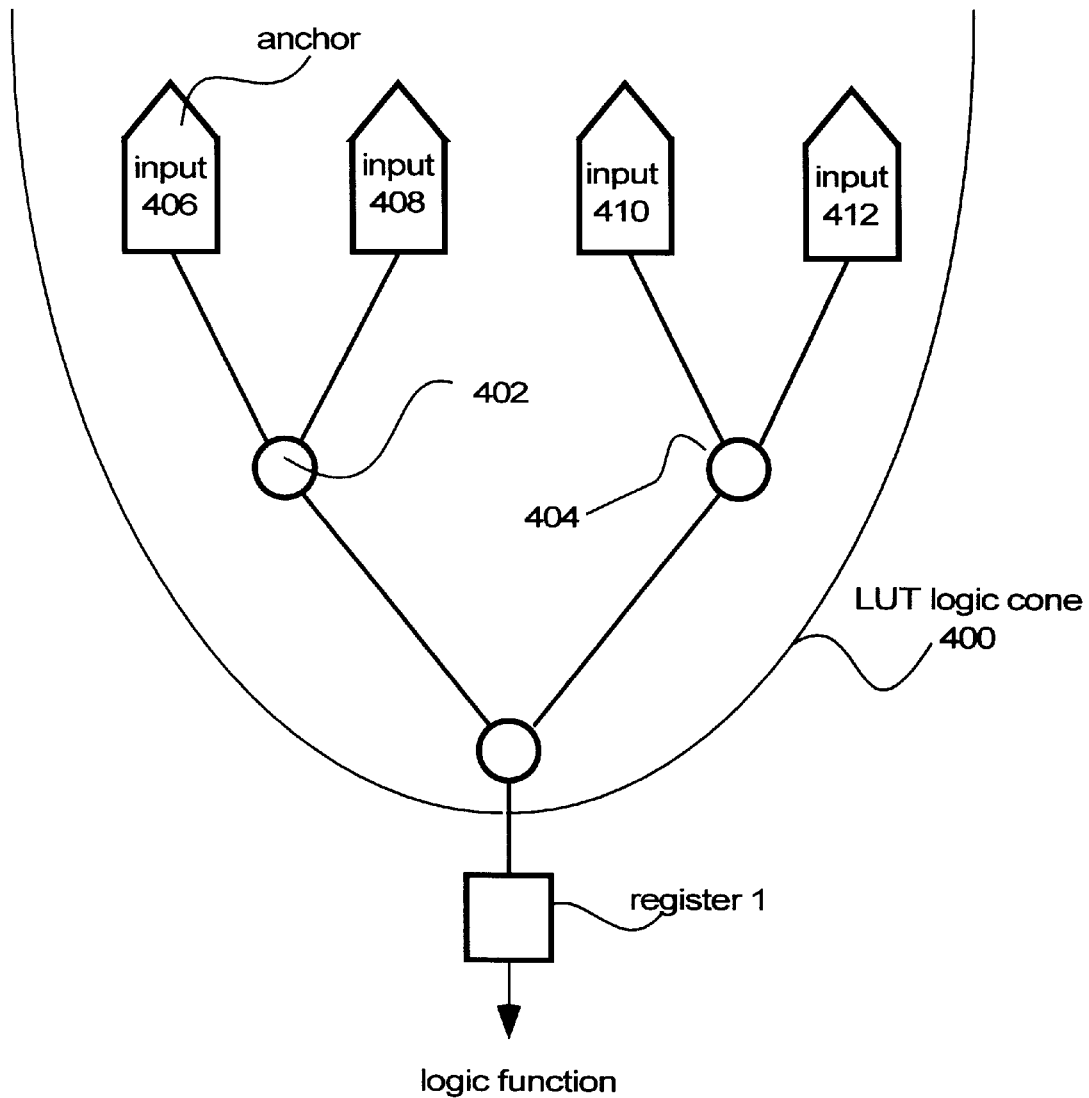
FIG. 4A illustrates a LUT logic cone in accordance with an embodiment of the invention.
Figure 4B:
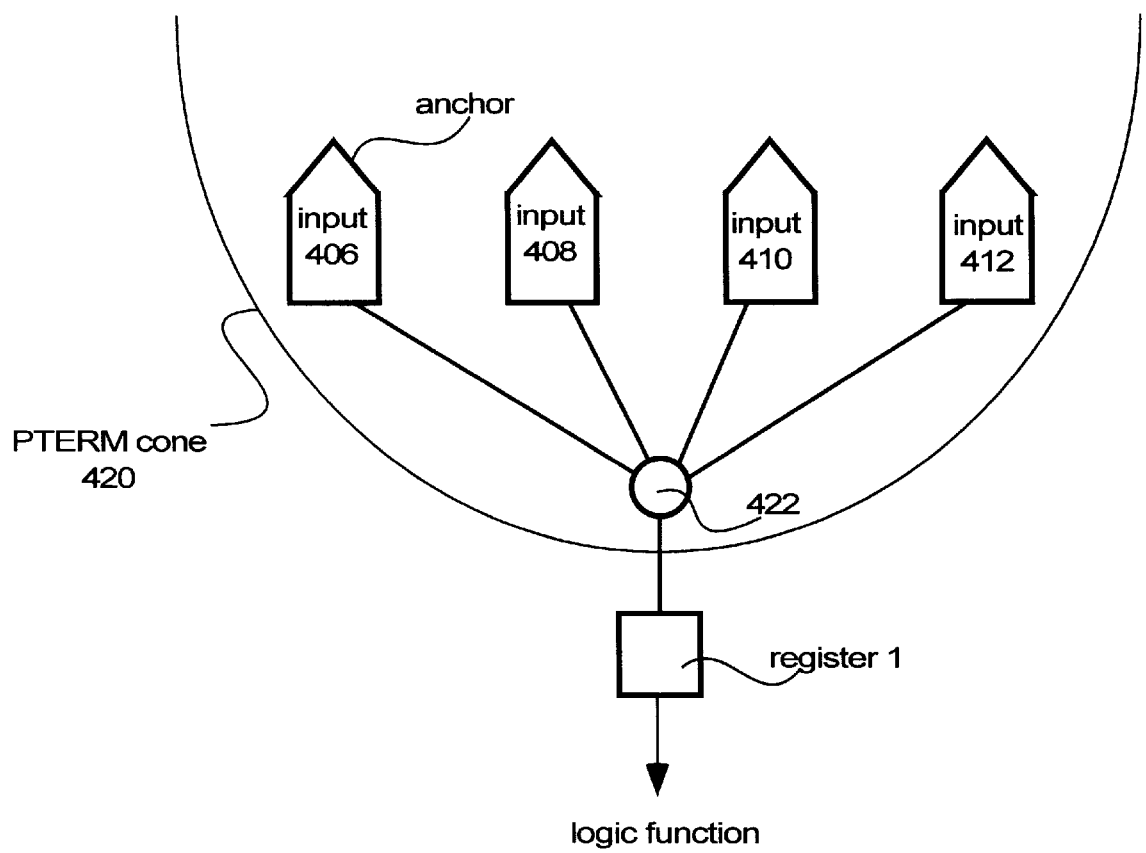
FIG. 4B illustrates a PTERM logic cone in accordance with an embodiment of the invention.

In an embodiment of the invention, a logic cone is defined as that portion of the netlist that lies between two anchor points. By definition therefore, a logic cone represents a particular logic function as defined by the logic signal at an associated anchor point. By way of example, FIG. 4A illustrates a LUT logic cone 400 representing a particular logic function at a register 1 (anchor). The second anchor point is represented by input pins 406–412. In the example of FIG. 4A, each nodes of 402 and 404 represent a single LUT logic element. FIG. 4B illustrates a PTERM logic cone 420 representing the same logic function as the LUT logic cone 400. Therefore, it is important to note the PTERM logic cone 420 and the LUT logic cone 400 represent regions of equivalent logic in that each may be identically used to form the particular logic function output at either the register 1 and/or the input pins 406–412. As can be seen in FIG. 4A and FIG. 4B, only one PTERM logic element 422, in this example, is required to form the requisite logic function at register 1 and/or inputs 406–412 as compared to at least the two LUT logic elements 402 and 404 included in the LUT logic cone 400.

Figure 4C:
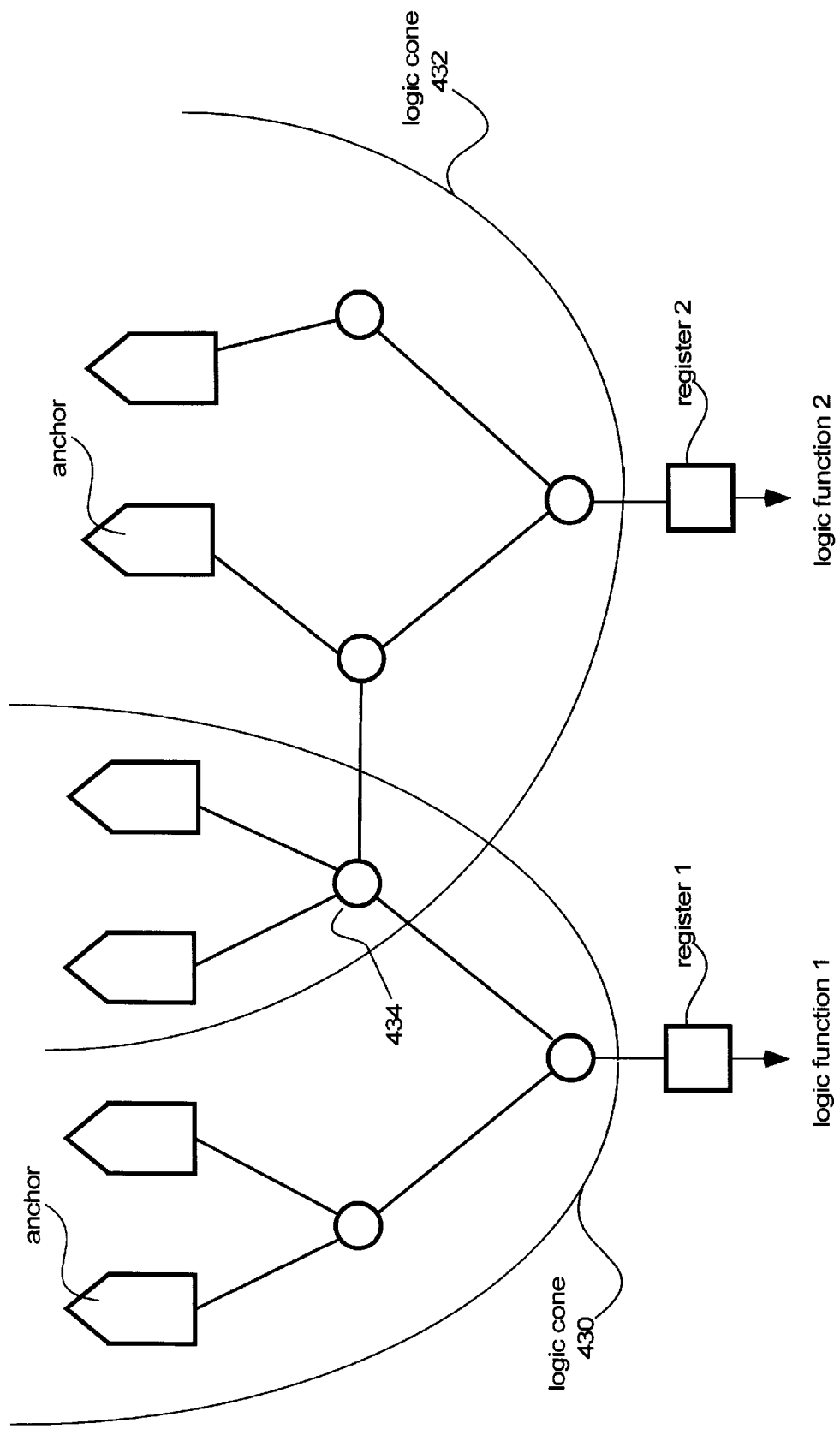
FIG. 4C illustrates overlapping logic cones in accordance with an embodiment of the invention.

It should also be noted, that in some cases, logic cones of either type may "overlap". By overlap it is meant that in some cases one logic cone shares a logic element with one or more other logic cones. In these cases, the shared logic elements may be weighted by a predetermined weighting factor to account for the fact that it is included in more than one logic cone. This allows for a "fair" comparison of the competing LUT and PTERM implementations of the logic contained within the affected logic cones. Such a situation is illustrated in FIG. 4C showing a case with two PTERM logic cones 430 and 432 are overlapping since each shares a common logic element 434 between them. In this case, because either one of the logic cones 430 or 432 is used in a comparison with other PTERM or LUT logic cones, a weighting factor associated with the shared logic element 434 can be used to modify, if necessary, the contribution of the logic element 434 to the logic cones 430 and 432 in which it is shared. By way of example, in one embodiment, the weighting factor of a logic element shared amongst N cones is 1/N making that shared cone "cheaper" than a non-shared logic element. In that way, the "cheaper" logic element is preferentially selected over non-shared logic elements.

Once a cone containing one or more shared logic elements has been selected, the weight of the shared logic elements in that cone is set to zero because once included in the circuit, they are effectively free to other cones which use the same shared logic elements. However, if a cone containing a shared logic element is discarded, (i.e., its partner has been selected), then the weight of the shared logic element is increased from 1/N to 1(N−1), as there are now fewer cones to share the remaining logic elements.

By using logic cones, the relative "cost" of implementing a particular logic function can be readily determined. "Cost" can be, for example, the logic density or cost can be that area in the target hardware device required to implement the particular logic function using either LUT or PTERM logic. Cost can also be the time required for a signal to travel along the net from one anchor to another. In this way, a particular design can be optimized for any characteristic deemed appropriate for the application at hand. By way of example, in FIG. 4A and FIG. 4B, the LUT logic cone 400 utilizes two LUT logic elements to implement the same logic function that the PTERM logic cone 420 implements using a single PTERM logic element. Assuming that a PTERM logic element occupies the same or less area than a LUT logic element, then the logic cone would be implemented as PTERM logic elements (if the goal is to conserve area). Therefore, in a PLD having both LUTs and PTERMs, it is desirable to be able to selectively choose a combination of LUT logic cones and PTERM logic cones to optimize for a desired characteristic, such as area.

Figure 5:
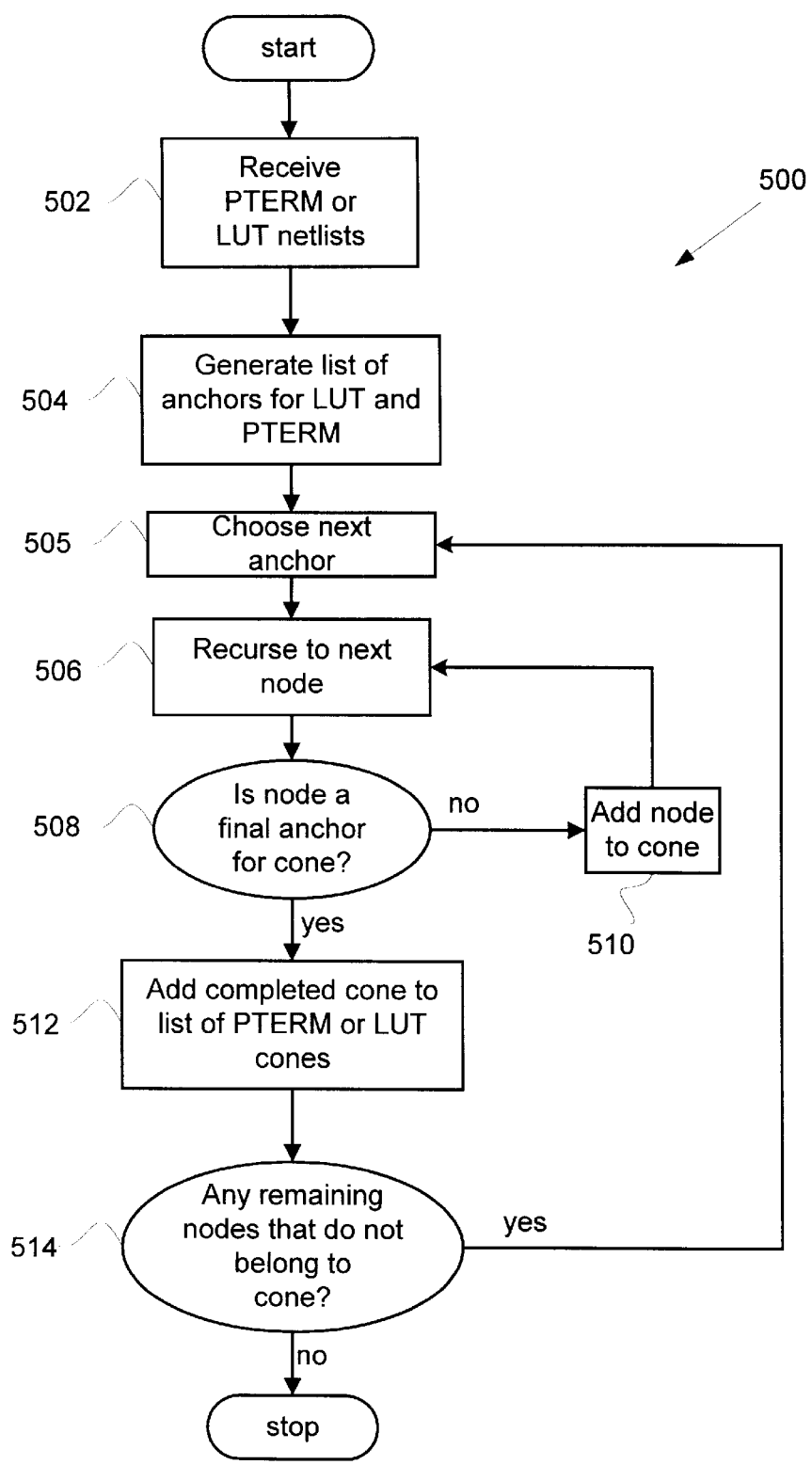
FIG. 5 details a process for generating a list of PTERM logic cones and a list of LUT logic cones in accordance with an embodiment of the invention.

FIG. 5 illustrates one possible process flow 500 for forming a logic cone in accordance with an embodiment of the invention. This flow corresponds to PTERM and LUT implementation procedures 210 and 212 depicted in FIG. 2. As shown, the logic cone forming process 500 begins at 502, by receiving a synthesized netlist for either the PTERM or LUT logic elements for the electronic design to be fitted in the PLD. Note that process 500 should be performed both the PTERM mapping and the LUT mapping. These netlists contain logic cells which have already been mapped for PTERM or LUT hardware. From the netlist, a list of anchors (for both the PTERM and LUT mappings) are generated (504) where each anchor represents the same logic function boundary, as described above. One of the anchors from the list is then chosen (505). This anchor will serve as one boundary of a logic cone to be elucidated by recursion. It also is the starting point for the recursion process.

After the anchor is chosen, the system recurses (506) to the next node coupled to the anchor. In one embodiment, the next node may an input to the anchor, assuming that the anchor is an output boundary for the logic cone. In another embodiment, the next node is an output of the anchor; assuming that the anchor is an input boundary. Usually the node will be a logic element as mapped at procedure 206 or 208 of FIG. 2. But it may also be another anchor.

After the recursion move (506), the current node of the recursion is examined (508) to determine whether or not it represents a final anchor for the current cone. Note that there may be more than two anchors for a given cone (see FIG. 4A for example). If it is determined that the current node is not a final anchor, then that node is added (510) to the current cone. Process control then returns to (506) where the system recurses to the next node adjacent to the previously considered node. That new node is then examined to determine whether it is a final anchor (508). So long as the recursion continues to locate non-final anchors, the cone grows via loop (506), (508) and (510).

Once the final anchor has been found [(508) is answered in the affirmative], all input and output anchors and all intervening logic nodes are deemed to a complete logic cone and added to a list of PTERM or LUT logic cones (512). Thereafter, the system determines (514) whether any nodes remain that have not been grouped into a logic cone. If so, process control returns to (505) where the system chooses the next anchor—one that will serve as a boundary for a logic cone including one or more of the ungrouped nodes. Thereafter the recursion process delineates a cone as described above.

Eventually each node in the netlist (PTERM or LUT) will be grouped into one or more logic cones. That is, (514) is answered in the negative. At this point, a complete set of logic cones has been produced and the overall process 500 is complete. As indicated above, the above process is performed on both the PTERM netlist and the LUT netlist to form PTERM logic cone/LUT logic cone pairs each representing equivalent logic functions.

Figure 6:
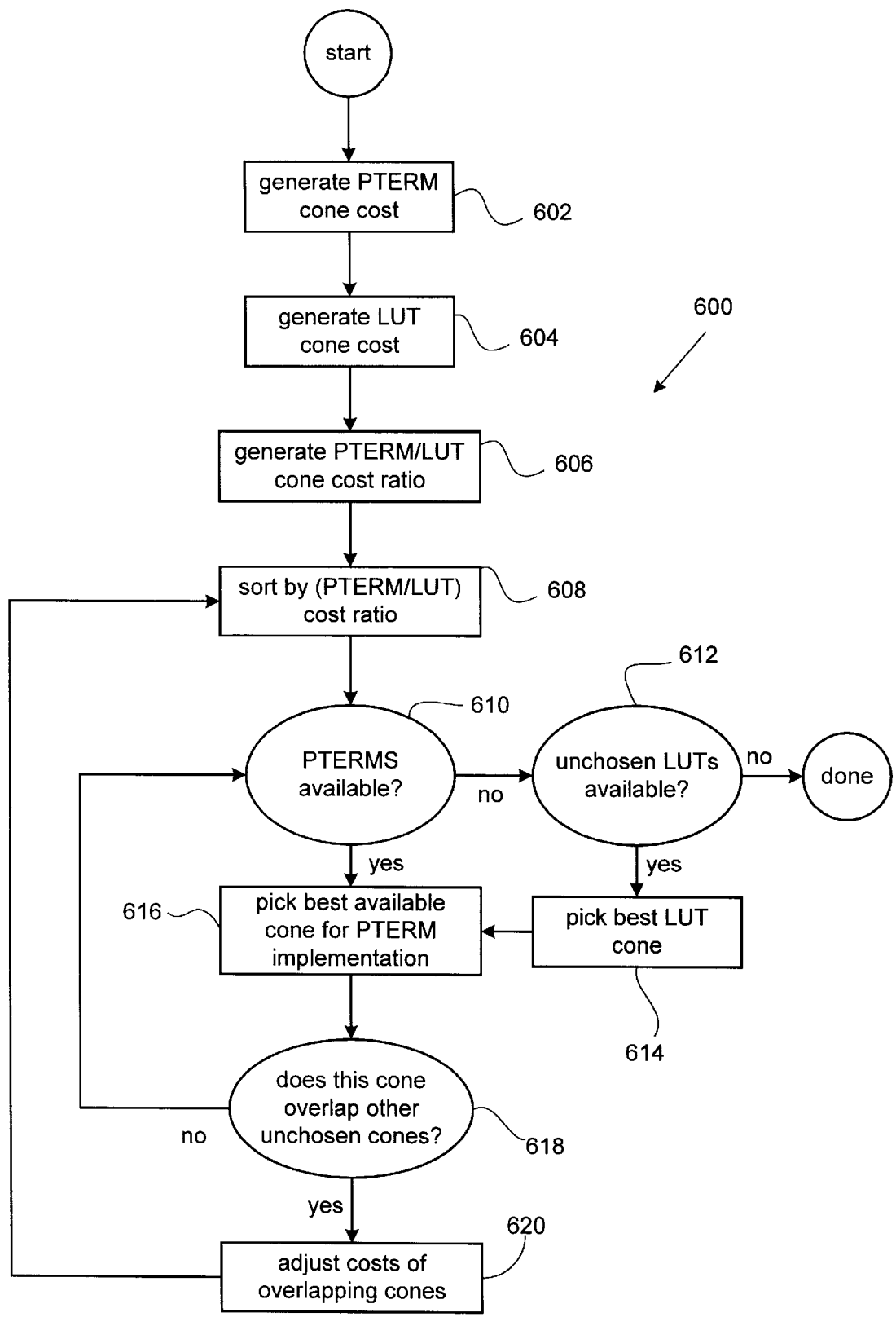
FIG. 6 details a process for choosing the best combination of PTERM logic cones and LUT logic cones in accordance with an embodiment of the invention.

FIG. 6 details a possible process 600 for choosing the best PTERM/LUT logic cones in accordance with an embodiment of the invention. Once a list of PTERM logic cone/ LUT logic cone pairs are formed, a cost is calculated for each of the PTERM logic cones (602) and the LUT logic cones (604) in each PTERM logic cone/LUT logic cone pair. As discussed above, the cost can represent such characteristics as area used to implement the logic, speed performance, etc. In the example under discussion, in order to optimize for size, it would be desirable to calculate the relative amount of area required to implement each of the PTERM logic cones and the LUT logic cones. Once this cost calculation has been completed relative cost ratios of each PTERM logic cone/LUT logic cone pair can be calculated (606). A representative sample of such relative cost calculations is presented in TABLE 1.

TABLE 1

| PTERM | Relative Cost Ratio |
| --- | --- |
| 1 | 1.1 |
| 2 | .68 |
| 3 | 1.2 |
| 4 | .70 |

TABLE 1 lists representative PTERM logic cones and the associated relative cost ratio of its associated LUT logic cone. By way of example, a PTERM logic cone 1 has a relative cost ratio of 1.1 meaning that the cost to implement the equivalent logic in PTERM logic elements is 1.1 as much as the cost to implement the same logic in LUT logic elements. By the same token, the cost to implement a particular logic function represented by a PTERM logic cone 2 is only 0.68 of the cost to implement that same logic in LUT logic elements. Therefore, in order to optimize the implementing of a particular logic function, the "best" PTERM logic cones are used until no more PTERMs cones are available. In this way, the electronic design is implemented using the "best" combination of PTERM logic elements and LUT logic elements.

Once the relative PTERM/LUT costs have been calculated, the PTERM/LUT pairs are sorted by relative cost ratio (608). The sorting is based upon the selected characteristic desired characteristic for the particular electronic design. In practice, there are rarely enough PTERM and LUT logic elements to optimally map all logic cones based upon cost, therefore, in the RAPHAEL architecture, for example, the number of PTERM logic cones will exhausted before all of the LUT logic cones have been chosen. If, for example, it is determined that all available PTERM logic elements have been chosen (610), then if there are any unchosen LUT logic cones (612), then all the remaining LUT logic cones are selected (614). If however, there are PTERM logic cones available to be chosen (610), then the "best" PTERM logic cone is chosen (616). Next, it is determined if the chosen PTERM logic cone, or its corresponding not chosen LUT cone, overlaps another unchosen cone (618). In situations such as this, the relative cost of the overlapping cones must be adjusted to account for the fact that certain of the logic nodes are being shared between more than one cone. Once the relative cost advantage has been adjusted for overlapping (620), the PTERM/LUT cost ratios are sorted again (608) to re-establish a priory ordering based upon the adjusted cost ratios.

The choosing is completed when either all available PTERM logic cones and all available LUT logic cones have been selected or when enough of either logic cone has been selected to form the desired electronic design. When the choosing is completed, the final mapping to the target hardware device is performed followed by the final place and route.

Embodiments of the present invention relate to an apparatus for performing the above-described operations. This apparatus may be specially constructed for the required purposes, or it may be a general purpose computer selectively activated or reconfigured by a computer program stored in the computer. The processes presented herein are not inherently related to any particular computer or other apparatus. In particular, various general purpose machines may be used with programs written in accordance with the teachings herein, or it may be more convenient to construct a more specialized apparatus to perform the required method steps. The required structure for a variety of these machines will appear from the description given above.

In addition, embodiments of the present invention further relate to computer readable media that include program instructions for performing various computer-implemented operations. The media and program instructions may be those specially designed and constructed for the purposes of the present invention, or they may be of the kind well known and available to those having skill in the computer software arts. Examples of computer-readable media include, but are not limited to, magnetic media such as hard disks, floppy disks, and magnetic tape; optical media such as CD-ROM disks; magneto-optical media such as floptical disks; and hardware devices that are specially configured to store and perform program instructions, such as read-only memory devices (ROM) and random access memory (RAM). Examples of program instructions include both machine code, such as produced by a compiler, and files containing higher level code that may be executed by the computer using an interpreter.

Figure 7:
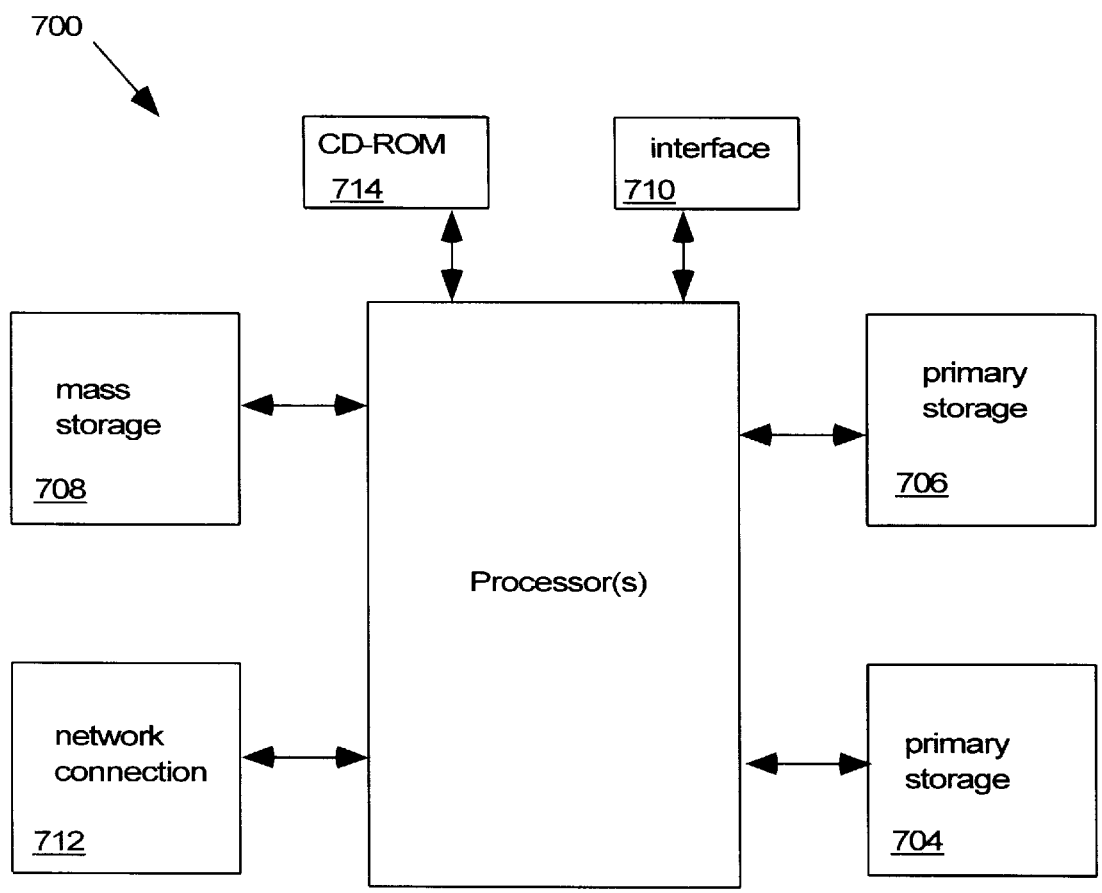
FIG. 7 illustrates a typical computer system in accordance with an embodiment of the present invention.

FIG. 7 illustrates a typical computer system in accordance with an embodiment of the present invention. The computer system 700 includes any number of processors 702 (also referred to as central processing units, or CPUs) that are coupled to storage devices including primary storage 706 (typically a random access memory, or RAM), primary storage 704 (typically a read only memory, or ROM). As is well known in the art, primary storage 704 acts to transfer data and instructions uni-directionally to the CPU and primary storage 706 is used typically to transfer data and instructions in a bi-directional manner. Both of these primary storage devices may include any suitable of the computer-readable media described above. A mass storage device 708 is also coupled bi-directionally to CPU 702 and provides additional data storage capacity and may include any of the computer-readable media described above. The mass storage device 708 may be used to store programs, data and the like and is typically a secondary storage medium such as a hard disk that is slower than primary storage. It will be appreciated that the information retained within the mass storage device 708, may, in appropriate cases, be incorporated in standard fashion as part of primary storage 706 as virtual memory. A specific mass storage device such as a CD-ROM 714 may also pass data uni-directionally to the CPU.

CPU 702 is also coupled to an interface 710 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 702 optionally may be coupled to a computer or telecommunications network using a network connection as shown generally at 712. With such a network connection, it is contemplated that the CPU might receive information from the network, or might output information to the network in the course of performing the above-described method steps. The above-described devices and materials will be familiar to those of skill in the computer hardware and software arts.

Figure 8:
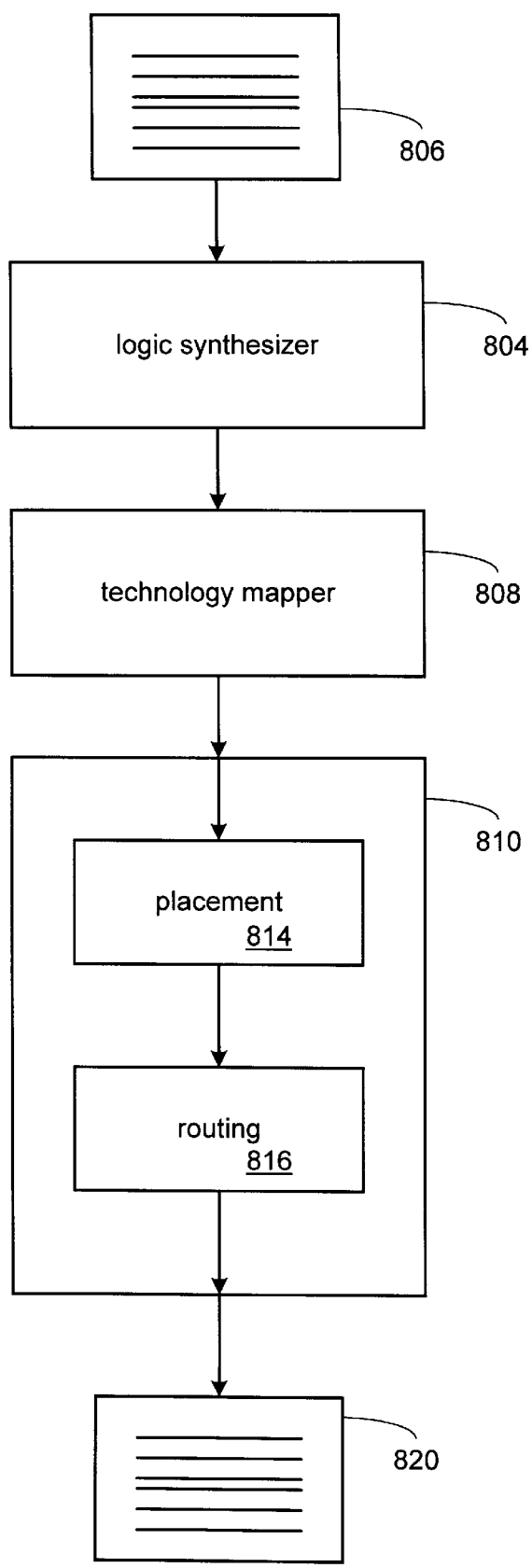
FIG. 8 illustrates a compiler in accordance with an embodiment of the invention.

The hardware elements described above may be configured (usually temporarily) to act as multiple software modules for performing the operations of this invention. For example, instructions for running a compiler may be stored on mass storage device 708 or 714 and executed on CPU 708 in conjunction with primary memory 706. In a preferred embodiment, the compiler is divided into software submodules. Referring to FIG. 8, a compiler 802 includes a logic synthesizer 804 which creates a synthesized netlist from a user's high level electronic design 806. Compiler 802 also includes a technology mapper 808 which maps gates from the synthesized netlist into logic cells. The technology mapper also identifies and compares logic cones for competing hardware implementations in a heterogeneous environment. Finally, compiler 802 includes a place and route module 810 which in turn includes a placement module 814 and a routing module 816. Placement module 814 places logic cells onto specific logic elements of a target hardware device. Routing module 816 connects wires between the inputs and outputs of the various logic elements in accordance with the logic required to implement the electronic design. Compiler 802 outputs a compiled design 820. It should be understood that other compiler designs may be employed with this invention. For example, some compilers will include a partitioning module to partition a technology mapped design onto multiple hardware entities. In addition, the compiler may be adapted to handle hierarchical designs, whereby synthesis, mapping, etc. Are performed recursively as the compiler moves down branches of a hierarchy tree.

Figure 9:
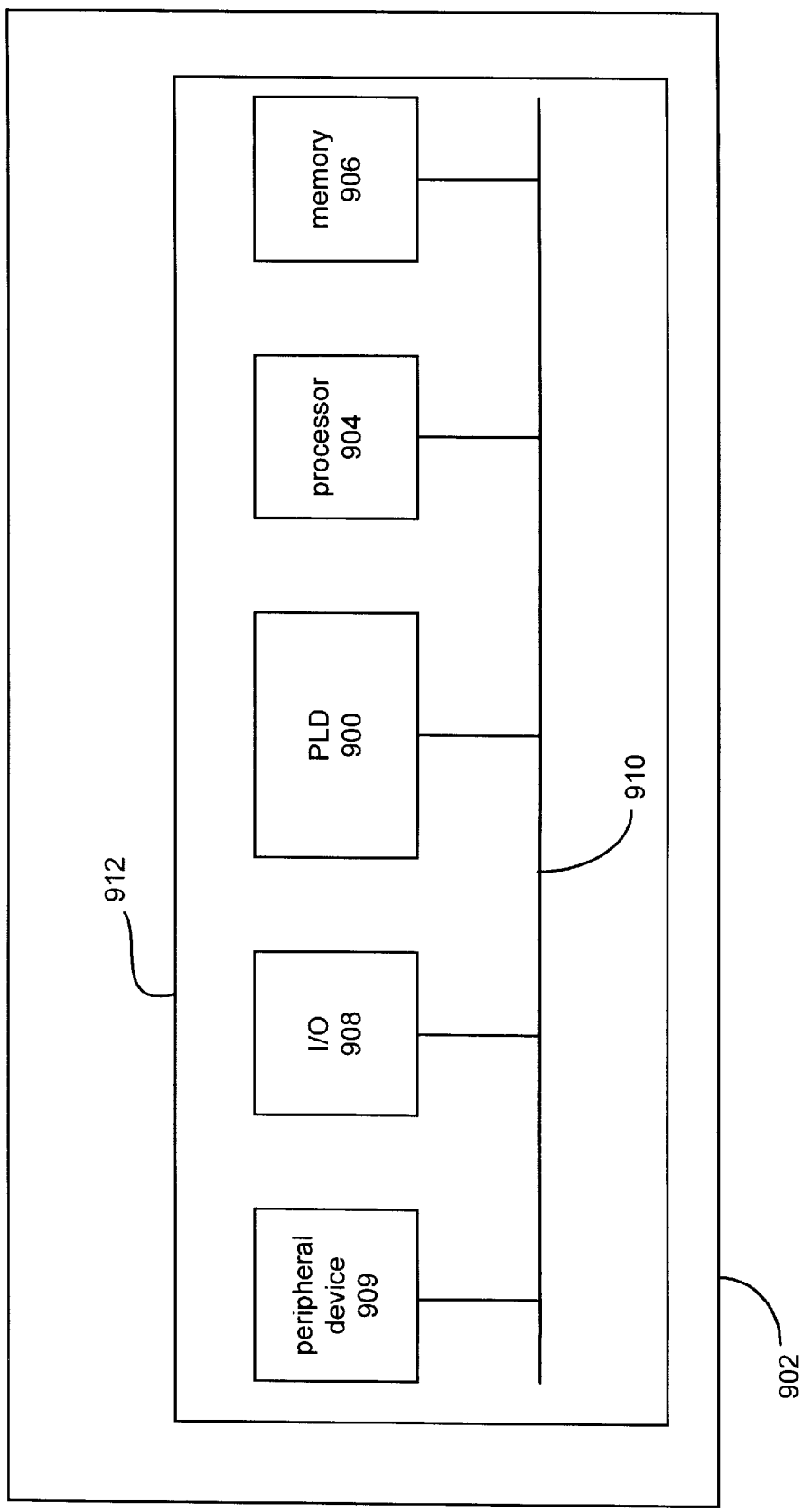
FIG. 9 illustrates a PLD of the present invention in a data processing system.

This invention also relates to programmable logic devices programmed with a design prepared in accordance with the above described methods. The invention further relates to systems employing such programmable logic devices. FIG. 9 illustrates a PLD 900 of the present invention in a data processing system 902. The data processing system 902 may include one or more of the following components: a processor 904; memory 906; I/O circuitry 908; and peripheral devices 909. These components are coupled together by a system bus 910 and are populated on a circuit board 912 which is contained in an end-user system 914.

The system 902 can be used in a wide variety of applications, such as computer networking, data networking, instrumentation, video processing, digital signal processing, or any other application where the advantage of using reprogrammable logic is desirable. The PLD 900 can be used to perform a variety of different logic functions. For example, PLD 900 can be configured as a processor or controller that works in cooperation with processor 904. The PLD 900 may also be used as an arbiter for arbitrating access to a shared resource in the system 902. In yet another example, the PLD 900 can be configured as an interface between the processor 904 and one of the other components in the system 902. It should be noted that the system 902 is only exemplary.

The foregoing describes the instant invention and its presently preferred embodiments. Numerous modifications and variations in the practice of this invention are expected to occur to those skilled in the art. For instance, the present invention may be used to map logic for any number of different heterogeneous environments, not just those employing PTERMs and LUTs. For example, this technique would work well if we wished to map to a hypothetical programmable logic device containing a mixture of LUTs and multiplexer-based logic elements as used in programmable logic devices manufactured by the Actel Corporation of Sunnyvale, Calif.

In addition, the technique and system of the present invention is suitable for use with a wide variety of EDA tools and methodologies for programming a device. Therefore, the described embodiments should be taken as illustrative and not restrictive, and the invention should not be limited to the details given herein but should be defined by the following claims and their full scope of equivalents.

What is claimed is:

1. A method of mapping an electronic design to a target hardware device using a plurality of heterogeneous logic elements, the target hardware device including first type logic elements and second type logic elements interconnected by way of programmable connectors, comprising:

(a) forming a first logical region using the first type logic element;
   (b) forming a second logical region using the second type logic element, wherein the first logical region and the second logical region perform logically equivalent sub-functions of the electronic design;
   (c) comparing the first and the second logical regions;
   (d) choosing either the first logical region or the second logical region based upon the comparing (c);
   (e) adding the chosen logical region from operation (d) to a final mapping list; and
   (f) repeating operations (a)–(e) until the electronic design is fully mapped.

2. A method of mapping an electronic design using heterogeneous logic elements as recited in claim 1, wherein the first type logic element is a PTERM logic elements.

3. A method of mapping an electronic design using heterogeneous logic elements as recited in claim 2 wherein the second type logic element is a look up table (LUT) logic element.

4. A method of mapping an electronic design using heterogeneous logic elements as recited in claim 3, wherein the first logic region is a PTERM logic cone.

5. A method of mapping an electronic design using heterogeneous logic elements as recited in claim 4, wherein the second logic region is a LUT logic cone, wherein the PTERM logic cone and the LUT logic cone perform logically equivalent sub-functions of the electronic design.

6. A method of mapping an electronic design using heterogeneous logic elements as recited in claim 5, wherein the comparing comprises:

(g) calculating a PTERM logic cone's cost and an associated LUT logic cone's cost;
   (h) sorting the PTERM logic cone's cost and the associated LUT logic cone's cost using a pre-selected cost factor.

7. A method of mapping an electronic design using heterogeneous logic elements as recited in claim 6, wherein the choosing further comprises:

(i) determining if there are available PTERM logic elements;
   (j) if it is determined that there are no available PTERM logic elements, then selecting the best of the remaining unchosen LUT logic cones from operation (h); and
   (k) if it is determined that there are available PTERM logic elements, then selecting the highest ranked available PTERM logic cone.

8. A method of mapping an electronic design using heterogeneous logic elements as recited in claim 7, wherein the choosing further comprises:

(l) adjusting the cost of overlapping PTERM logic cones or overlapping LUT logic cones.

9. A method of mapping an electronic design using heterogeneous logic elements as recited in claim 1, wherein the target hardware device is a programmable logic device.

10. A method of mapping an electronic design using heterogeneous logic elements as recited in claim 6, wherein the pre-selected cost factor is logic density.

11. A method of mapping an electronic design using heterogeneous logic elements as recited in claim 6, wherein the pre-selected cost factor is speed.

12. A method of mapping an electronic design to a heterogeneous device having first logic elements of a first type and second logic elements of a second type, the method comprising:

mapping the electronic design to conform to the first logic elements and thereby form a first mapping;
   mapping the electronic design to conform to the second logic elements and thereby form a second mapping; and
   comparing the first and second mappings of a logically equivalent logic region to choose one of these mappings for implementing the logic region on a target hardware device.

13. The method of claim 12, wherein the mapping is performed during compilation of the electronic design.

14. The method of claim 12, further comprising synthesizing the electronic design prior to the mappings.

15. The method of claim 12, further comprising placing the chosen mapping of the logic region on the target hardware device.

16. The method of claim 12, further comprising performing the comparing operation for a plurality of logic regions of the electronic design.

17. The method of claim 12, further comprising defining the logic region prior to comparing the first and second mappings.

18. The method claim 17, wherein defining the logic region comprises:

identifying anchor nodes that are functionally equivalent in both the first and second mappings; and
   identifying as said logic region, logic bounded by at least two of said anchor nodes.

19. The method of claim 18, wherein the anchor nodes include at least registers and I/O nodes.

20. The method of claim 12, wherein the first logic elements are PTERM logic elements and wherein the second logic elements are look up table logic elements.

21. An electronic device implementing the electronic design as mapped by the method of claim 12.

22. A programmable logic device implementing the electronic design as mapped by the method of claim 12.

23. A computer program product comprising computer program instructions provided on a computer readable medium, the computer program instructions specifying a method of mapping an electronic design to a heterogeneous device having first logic elements of a first type and second logic elements of a second type, the method comprising:

mapping the electronic design to conform to the first logic elements and thereby form a first mapping;
   mapping the electronic design to conform to the second logic elements and thereby form a second mapping; and
   comparing the first and second mappings of a logically equivalent logic region to choose one of these mappings for implementing the logic region on a target hardware device.

24. The computer program product of claim 23, wherein the computer program instructions define additional operations for compiling the electronic design.

25. The computer program product of claim 23, wherein the computer program instructions specify defining the logic region prior to comparing the first and second mappings.

26. The computer program product of claim 25, wherein the computer program instructions specify that defining the logic region comprises:

identifying anchor nodes that are functionally equivalent in both the first and second mappings; and identifying as said logic region, logic bounded by at least two of said anchor nodes.

27. The computer program product of claim 23, wherein the first logic elements are PTERM logic elements and the second logic elements are look up table logic elements.

28. The computer program product of claim 23, wherein the comparing operation involves determining a cost associated with each mapping of the logic region.

29. The computer program product of claim 28, wherein the cost is logic density, speed, or a combination thereof.

* * * * *